United States Patent [19]

Sugata et al.

[11] Patent Number: 4,991,541
[45] Date of Patent: Feb. 12, 1991

[54] DEVICE AND PROCESS FOR TREATING FINE PARTICLES

[75] Inventors: Hiroyuki Sugata; Masao Sugata, both of Yokohama; Noriko Kurihara, Kawasaki; Tohru Den, Tokyo; Kenji Ando, Kawasaki; Osamu Kamiya, Machida, all of Japan

[73] Assignee: Canon Kabushiki Kaisha, Tokyo, Japan

[21] Appl. No.: 443,862

[22] Filed: Nov. 30, 1989

Related U.S. Application Data

[63] Continuation of Ser. No. 99,749, Sep. 22, 1987, abandoned.

[30] Foreign Application Priority Data

Sep. 25, 1986 [JP] Japan .................. 61-224929

[51] Int. Cl.$^5$ ............................................. C23C 16/00
[52] U.S. Cl. .................................... 118/716; 118/715; 118/719; 118/723; 118/725
[58] Field of Search ............... 118/715, 716, 719, 723, 118/725; 427/14, 15, 16, 17, 255.2, 255.3; 204/178

[56] References Cited

U.S. PATENT DOCUMENTS

| | | | |
|---|---|---|---|
| 3,169,914 | 2/1965 | Young | 204/178 |
| 3,260,235 | 7/1966 | Witz | 118/716 |
| 3,280,018 | 10/1966 | Denis | 204/178 |
| 3,332,870 | 7/1967 | Orbach | 204/178 |
| 4,050,408 | 9/1977 | Beucherie | 118/723 |
| 4,082,636 | 4/1978 | Takagi | 118/723 |
| 4,120,700 | 10/1978 | Morimoto | 204/192.31 |
| 4,281,029 | 7/1981 | Takagi | 204/192.31 |
| 4,354,909 | 10/1982 | Takagi | 204/192.31 |
| 4,401,054 | 8/1983 | Matsuo | 427/47 |
| 4,451,499 | 5/1984 | Morimoto | 204/192.31 |
| 4,484,943 | 11/1984 | Miura | 75/0.5 B |
| 4,505,795 | 3/1985 | Alamaro | 204/178 |
| 4,508,682 | 4/1985 | Miura | 427/255.2 |
| 4,533,382 | 8/1985 | Miura | 266/200 |
| 4,533,383 | 8/1985 | Miura | 266/200 |
| 4,533,413 | 8/1985 | Miura | 266/200 |
| 4,576,725 | 3/1986 | Miura | 75/0.5 B |
| 4,617,055 | 10/1986 | Miura | 75/0.5 B |
| 4,632,849 | 12/1986 | Ogawa | 427/253 |
| 4,642,227 | 2/1987 | Flagan | 118/716 |
| 4,682,564 | 7/1987 | Cann | 118/723 |

FOREIGN PATENT DOCUMENTS

51725  3/1985  Japan ..................... 427/423

OTHER PUBLICATIONS

Ono, Jap. J. Ap. Phys., vol. 23, No. 8, Aug. 1984, pp. L534–L536.
Maissel, Handbook of Thin Film Technology, McGraw Hill Book Co., ©1970, chapter 2, pp. 5–7.

Primary Examiner—Richard Bueker
Attorney, Agent, or Firm—Fitzpatrick, Cella Harper & Scinto

[57] ABSTRACT

A device for treating fine particles is provided which comprises a plural number of reaction chambers for providing reaction fields different from each other provided along the flow pathway on the downstream side of a nozzle which jets out fine particles in a beam. The device may be provided with a chamber for a starting material for forming fine particles. The nozzle may be a convergent-divergent nozzle.

12 Claims, 4 Drawing Sheets

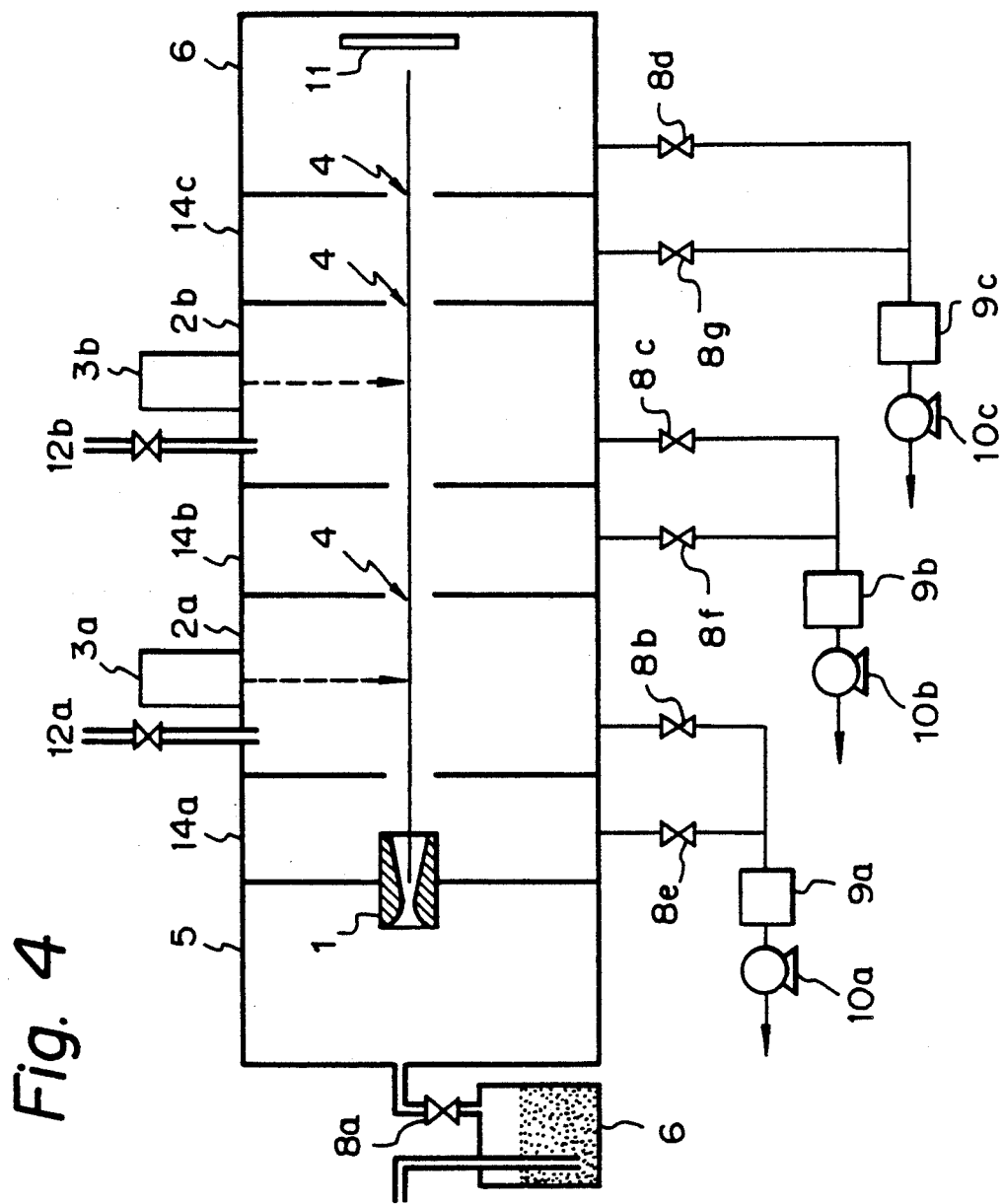

DEVICE AND PROCESS FOR TREATING FINE PARTICLES

This application is a continuation of application Ser. No. 07/099,749 filed Sept. 22, 1987, now abandoned.

BACKGROUND OF THE INVENTION

1. Field of the Invention

This invention relates to a device for treating fine particles and a process for performing surface treatment such as multi-layer coating or surface modification, etc. of fine particles at high efficiency.

2. Related Background Art

Ultra-fine particles have extremely active surfaces, and therefore usually stabilized by subjecting the surfaces to slow oxidation in a stream of argon gas.

In recent years, for improvement of the properties of ceramic product, and further for developing products imparted with new functions, it has been considered to utilize positively the surface treatment of ceramic fine particles.

As the methods for surface treatment of fine particles, there may be included a gas phase method, a liquid phase method, a autoclave method, and a mechano-chemical method.

However, in the treatment devices of the prior art, different energies could not be imparted to a material flowing continuously, and there is no example in which multiple steps of gas phase reactions can be performed in a series of the systems. Accordingly, in conducting a multiple-step gaseous reaction, such as formation of a new substance via multiple steps of gaseous reactions, the reaction need be conducted separately in plural times, and the procedure will be complicated.

SUMMARY OF THE INVENTION

An object of the present invention is to provide a novel device for treating fine particles in a plural number of steps within the same system.

Another object of the present invention is to provide a process for treating fine particles which can perform surface treatment of fine particles at high speed and yet with good efficiency.

Still another object of the present invention is to provide a device for treating fine particles capable of performing surface treatment of fine particles and effecting film formation onto a substrate.

According to an aspect of the present invention, there is provided a device for treating fine particles, comprising a plural number of reaction chambers for providing reaction fields different from each other provided along the flow pathway on the downstream side of a nozzle which jets out fine particles in a beam.

According to another aspect of the present invention, there is provided a device for treating fine particles, comprising a starting material chamber for forming fine particles, a nozzle for jetting out fine particles connected to said starting material chamber, and a plural number of reaction chambers for providing reaction fields different from each other provided along the flow pathway on the downstream side of said nozzle.

According to a further aspect of the present invention, there is provided a process for treating fine particles, comprising a step of forming a beam of the fine particles, permitting said beam to pass through different reaction fields and impinging said beam onto a substrate.

According to a still further aspect of the present invention, there is provided a process for treating fine particles, comprising a step of forming fine particles, a step of forming a beam of said fine particles, permitting said beam to pass through different reaction fields and impinging said beam onto a substrate.

BRIEF DESCRIPTION OF THE DRAWINGS

FIG. 4 illustrates another example.

DETAILED DESCRIPTION OF THE PREFERRED EMBODIMENTS

Figure 2:
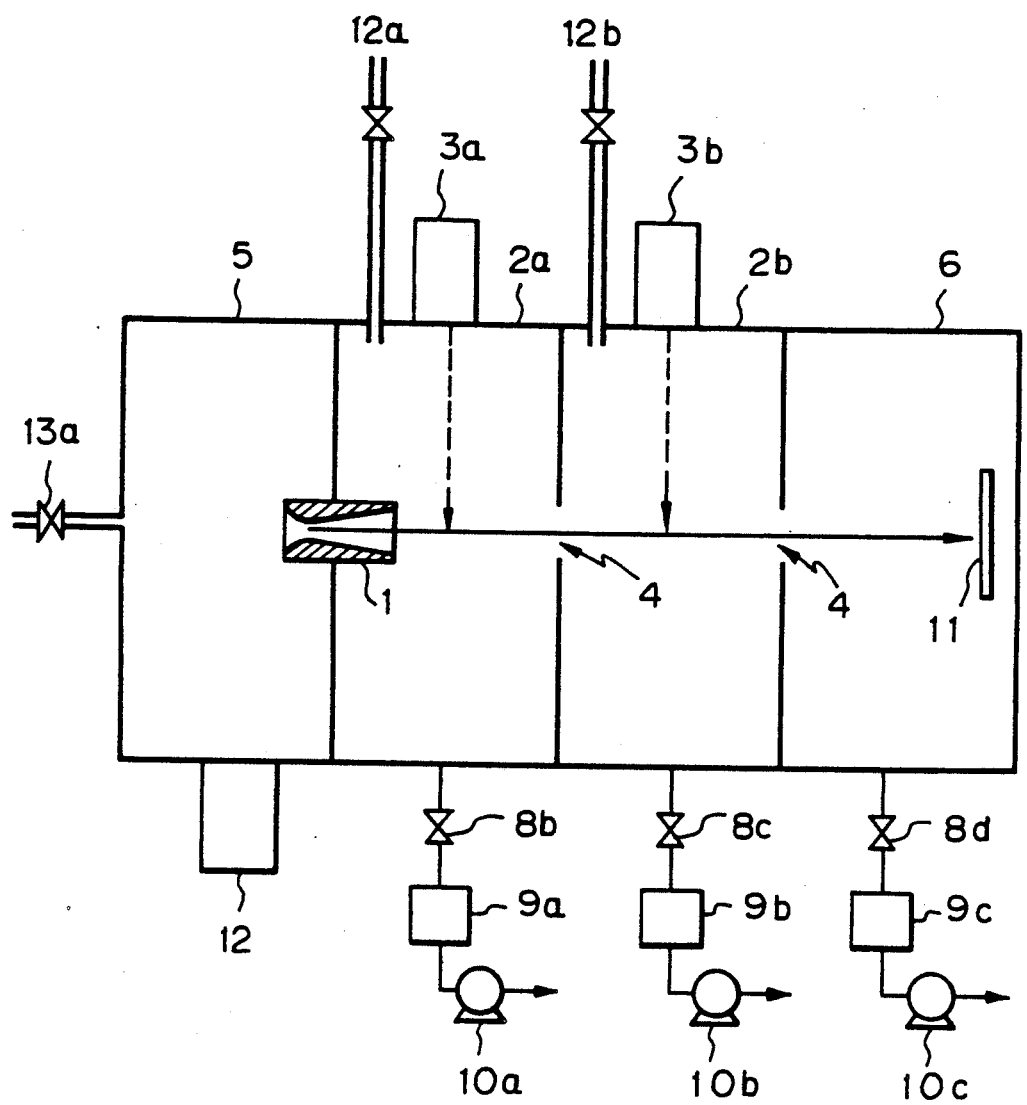
FIG. 1 and FIG. 2 illustrate examples of the present invention.

A flow of fine particles jetted out through a nozzle 1 are converged by the nozzle 1. Accordingly, by deciding properly the shape of the nozzle 1 and the pressures on the upstream side and the downstream side thereof, the fine particles can be jetted out in a beam through the nozzle 1 into the reaction chambers 2a, 2b, etc.

As described above, since the pathway on the downstream side of the nozzle is constricted, only by providing a small opening 4 which can permit the flow to pass along this pathway, the starting material jetted out from the nozzle 1 can be introduced into a reaction chamber 2a, and further therefrom to a reaction chamber 2b. Also, since the respective reaction chambers 2a, 2b, etc. are provided respectively with different energy-imparting means 3a, 3b, etc. and gas-introducing pipes 12a, 12b, etc., the fine particles can be subjected to different gas phase reactions with the energy-imparting means 3a, 3b, etc. and the gas-introducing pipes 12a, 12b, etc. while passing through each of the reaction chambers 2a, 2b, etc., whereby multi-step gas phase reactions are effected.

On the other hand, since maintenance of the atmosphere between the reaction chambers 2a, 2b, etc. can be done with small openings 4 between the reaction chambers 2a, 2b, etc. due to constricted pathway, the pressures in the respective chambers 2a, 2b, etc. can be maintained approximately equal to each other.

Figure 1:
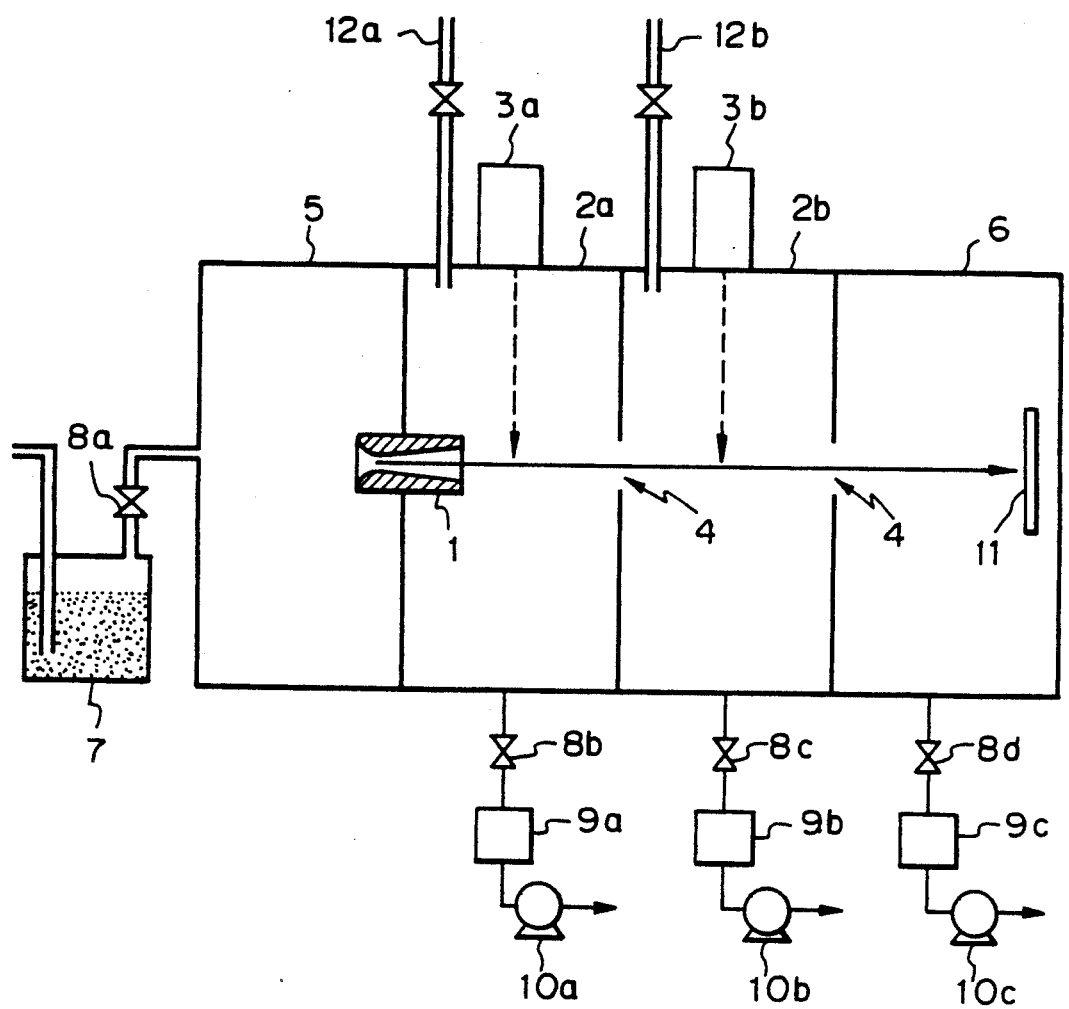

As shown in FIG. 1, a starting-material chamber 5, a reaction chambers 2a and 2b and a collecting chamber 6 are connected in series. The starting-material chamber 5 and the reaction chamber 2a are communicated through the nozzle 1, and the reaction chamber 2a to the collecting chamber 6 communicated through openings 4 provided in a straight line with the nozzle 1.

To the starting-material chamber 5 is connected a starting-material tank 7 containing fine particles of the starting material through the valve 8a. The starting material within the starting-material tank 7 is floated in the carrier gas fed into the starting-material tank 7 to be fed into the starting chamber 5.

The carrier gas may be a gas which does not participate at all in the gas phase reaction to be carried out in the reaction chambers and only conveys the fine particles of the starting material, but may also participate in the gas phase reactions.

When fine particles are used as the starting material, particularly ultra-fine particles are preferred. Such ultra-fine particles are those with sizes of several microns or less which can be obtained by an in-gas vaporization method, a plasma evaporation method, the vapor phase chemical reaction method which utilize a gas phase reaction, or further the colloidal precipitation method, the solution spraying pyrolysis method which utilize a liquid phase reaction, etc. The ultra-fine particles may be formed separately and fed into the reaction chamber 5 or alternatively may be formed in the starting-material chamber 5. The ultra-fine particles advantageously can be made into a jet stream in a constant convergency with the nozzle 1.

Downstream of the starting chamber 5, namely the reaction chambers 2a and 2b and the collecting chamber 6 are evacuated by the pumps 10a–10c connected respectively through the vales 8b–8c and the cleaners 9a–9c, to be placed under a pressure lower than that in the starting material chamber 5. Accordingly, the fine particles fed into the starting material chamber 5 will be jetted out through the nozzle 1 toward the downstream side. The fine particles jetted out from the nozzle 1 will pass through the reaction chambers through the openings 4 as the jet stream in its pathway constricted by the nozzle, and thereafter caught by the substrate 11 in the collecting chamber 6.

In the reaction chambers 2a and 2b, respective different energy-imparting means 3a and 3b and gas-introducing pipes 12a and 12b are provided. As the energy imparted by the energy-imparting means 3a and 3b, there may be included light such as UV-ray, IR-ray, visible light, etc. and other electromagnetic waves of various wavelengths, and heat, etc. Also, the different energy-imparting means 3a and 3b include the same electromagnetic waves which emit waves with different wavelengths and the same heat with different temperatures.

The gas introduced from the gas introducing pipes 12a and 12b is a gas to be reacted with fine particles, and may be preferably a gas which can promote the reaction in the presence of light or heat. The reaction chambers 2a and 2b are maintained under substantially the same pressure so that the fine particles provided for the reactions in both chambers 2a and 2b may not be mixed with each other. Also, for the purpose of preventing mixing of the atmospheres in the respective chambers 2a, 2b and 6, the openings 4 should be as small as possible within the range permitting the jet stream of the starting material to pass without great disturbance. The openings 4 should be preferably provided with a skimmer variable in opening size so that the size of the opening 4 can be controlled corresponding to the jet stream of the starting material.

While evacuating the reaction chambers 2a and 2b and the collecting chamber 6 by means of the pumps 10a–10c, the starting material is fed from the starting-material tank 7 into the starting-material chamber 5. The fine particles, as described above, enter first the reaction chamber 2a as a jet stream through the nozzle 1, wherein a gas phase reaction occurs by the energy-imparting means 3a and the gas introduced through the gas-introducing pipe 12a provided there. The jet stream of the fine particles which has undergone the reaction enters then the reaction chamber 2b, where the gas phase reaction in the second step occurs by the energy-imparting means 3b and the gas introduced from the gas-introducing pipe 12b, and thereafter collected onto the substrate 11 in the collecting chamber 6. In the course of these reactions, superfluous fine particles and carrier gas are taken out by pumps 10a–10c to maintain the pressure within the system appropriately. The cleaners 9a–9c are used for cleaning of discharged products by means of pumps 10a–10c, and contain, for example, a filter or an adsorbent.

FIG. 2 shows a modification example of FIG. 1, and a starting-material chamber 5 is provided with a microwave-introducing system 12 and a gas-introducing pipe 13a, and ultra-fine particles are prepared in the starting chamber 5.

The nozzle 1 may be a parallel nozzle or a convergent nozzle, but it should preferably a convergent-divergent nozzle as shown in FIG. 3. The convergent-divergent nozzle refers to one, which is gradually constricted in opening area from the flow inlet 1a to form a throat portion 1b and again expanded in opening area to become the flow outlet 1c.

The convergent-divergent nozzle can accelerate the flow of the starting material by controlling the pressure ratio $P/P_0$ of the pressure P in the reaction chamber 2a to the pressure $P_0$ in the starting-material chamber 5 and the ratio $A/A^*$ of the opening area A at the flow outlet 1c to the opening area $A^*$ of the throat portion 1b. And, if the pressure ratio $P/P_0$ in the starting-material chamber 7 and the reaction chamber 2a is the critical ratio of pressure or less, the outlet flow velocity at the convergent-divergent nozzle becomes the supersonic flow, whereby the starting material can be jetted out at supersonic velocity.

Here, the critical ratio of pressure refers to the following value. That is, when the flow velocity of the starting material is coincident with the acoustic velocity at the throat portion of the convergent-divergent nozzle, the flow velocity at the flow outlet 1c coincides ideally with the Mach number which is determined by the opening area ratio $A/A^*$ of the cross-sectional area A of the outflow outlet 1c to the cross-sectional area $A^*$ of the throat portion $A^*$. This relationship is represented specifically by the formula (3) as described below. And, relative to such Mach number, the pressure ratio $P/P_0$ of the pressure P in the reaction chamber 2a to the pressure $P_0$ in the starting material chamber 5 as determined by the following formula (1) is called critial ratio of pressure. $\gamma$ is the specific heat ratio of the flow of the starting material.

$$\frac{P}{P_0} = \left(1 + \frac{\gamma - 1}{2} M^2\right)^{\frac{\gamma-1}{\gamma}} \quad (1)$$

If the flow of the starting material is assumed to a compressive one-dimensional flow in adiabatic expansion, the Mach number M that can be reached by the flow is determined by the pressure $P_0$ of the upstream side and the pressure P of the downstream side, according to a following formula:

$$M = \frac{u}{a} = \sqrt{\left[\left(\frac{P_0}{P}\right)^{\frac{\gamma-1}{\gamma}} - 1\right]\frac{2}{\gamma - 1}} \quad (2)$$

wherein u is the velocity of the fluid, a is the acoustic velocity at the same point, and M exceeds 1 when the ratio $P/P_0$ is below the critical ratio of pressure.

The acoustic velocity a can be determined by the formula:

$$a = \sqrt{\gamma RT}$$

wherein T is the local temperature and R is gas constant. Also there stands a following relation among the aperture cross sections A, A* of the outlet 1c and throat 1b, and the Mach number M:

$$\frac{A}{A^*} = \frac{1}{M}\left[\frac{2}{\gamma+1}\left(1 + \frac{\gamma-1}{2}M^2\right)\right]^{\frac{\gamma+1}{2(\gamma-1)}} \quad (3)$$

It is therefore possible to jet out the starting material as an optimum expansion flow from a convergent-divergent nozzle by regulating the $P/P_0$ value to the critical ratio of pressure corresponding to M value determined by Formula (3) as a function of aperture area ratio $A/A^*$.

Here, optimum expansion refers to expansion of the starting material flowed when the pressure ratio of the reaction chamber 2a to the starting material chamber 5 is equal to the critical ratio of pressure. Also, the velocity u of the starting material can be determined by the following formula:

$$u = \sqrt{\gamma R T_0}\left\{\left[1 - (P_0/P)^{\frac{1-\gamma}{\gamma}}\right]\frac{2}{\gamma-1}\right\}^{\frac{1}{2}} \quad (4)$$

wherein $T_0$ is the gas temperature in the starting-material chamber 7.

As described above, by permitting the starting material in a certain direction as supersonic flow, the starting material will proceed straightforward while maintaining substantially the jet-stream cross-section immediately after jetting-out to be converted into a beam. Thus, the starting material is jetted out into the space in the reaction chambers 2a and 2b, and the collecting chamber 6 with minimum diffusion, independently spatially without interference of these wall surfaces and at a supersonic velocity.

The "beam" in the present invention means a jet stream flowing with directivity in one direction and with a higher density than that of surrounding space irrespective of the shape of the section of the stream.

When the jet stream comprises molecular particles, the beam characteristics can be detected by measuring the stream intensity of flying molecules by means of an orifice connected to a differential scanning evacuation system of a mass spectrometer and moving perpendicularly across the beam.

With a nozzle having a circular cross section, the output from the mass spectrometer has the maximum value at the center of the beam. The output value will decrease gradually with the distance from the center. The distance between the center of the beam and the point where the detected value has decreased to half the maximum output is measured. The beam diameter is defined as twice the distance measured above.

The divergence of the beam is evaluated by the divergence angle of the beam defined by the formula below:

$$\theta = \text{Tan}^{-1} \tfrac{1}{2}\{(d_2-d_1)/(l_2-l_1)\}$$

where $d_1$ denotes the beam diameter at a distance $l_1$ from the exit of the nozzle to downstream direction, and $d_2$ at the distance $l_2$.

The desirable $\theta$ value depends on the application field and the size restriction, It is generally not more than $\pi/6$, preferably $\pi/12$, and more preferably $\pi/18$. With a nozzle of non-circular nozzle section, the divergence angle can be defined correspondingly to the above definition of $\theta$.

For ultra-fine particles, the divergence of the beam can be evaluated from the $\theta$ value by means of a laser doppler velocimeter or photon correlation spectroscopy employing the technology of light-scattering spectroscopy.

Figure 3A:
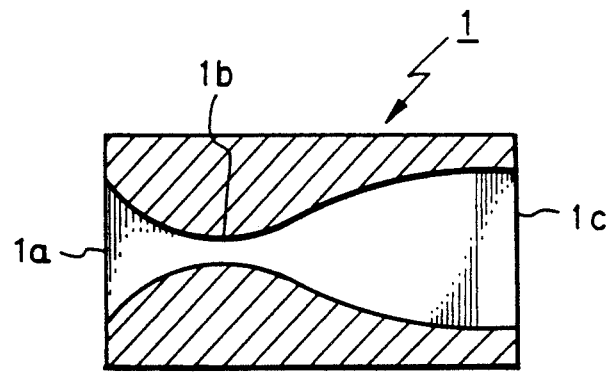
FIG. 3A to 3C illustrate exemplary shapes of convergent-divergent nozzles, respectively.
Figure 3B:
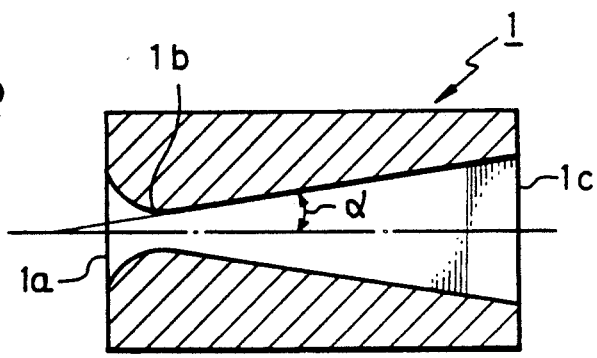
Figure 3C:
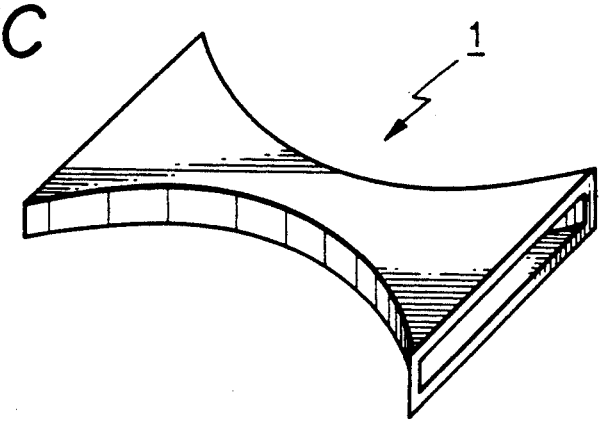

When a convergent-divergent nozzle is used as the nozzle 1, as shown in FIG. 3A, the inside circumferential surface should be substantially in parallel to the center axis at the flow outlet position 1c. This is because the flow direction of the starting material jetted out may be made a parallel flow as easily as possible, since it is influenced by the direction of the inner circumferential surface of the flow outlet 1c. However, as shown in FIG. 3B, if the angle of the inner circumferential surface from the throat portion 1b to the flow outlet 1c relative to the center axis is made 7° or lower, preferably 5° or lower, the flow of the starting material can be maintained substantially uniformly, and therefore in this case, it is not required to be made particularly parallel as described above. By omitting formation of the parallel portion, the convergent-divergent nozzle can be prepared easily. When the convergent-divergent nozzle is made rectangular as shown in FIG. 3C, the starting material can be jetted out in shape of a slit. The rectangular nozzle may be used either in the laterally longer state as shown in the drawing or in the longitudinally longer state.

Here, the above peel-off phenomenon refers to a phenomenon in which the boundary layer between the inside surface of the convergent-divergent nozzle and the passing fluid becomes greater to make the flow nonuniform, when there is a projection on the inside surface of the convergent-divergent nozzle, etc., which is liable to occur more frequently as the jetted stream is in higher velocity. The above-mentioned angle should be made smaller, for prevention of the peel-off phenomenon, for a convergent-divergent nozzle having an inside surface of less finishing precision. The inside surface of the convergent-divergent nozzle should be finished to precision preferably of the three reverse triangle marks or more, optimally four marks or more, representing the surface finishing degrees as determined by JIS B 0601. Particularly, since the peel-off phenomenon at the diverged portion of the convergent-divergent nozzle influences greatly the subsequent flow of the starting material, the convergent-divergent nozzle can be prepared easily by determining the above finishing precision primarily about the diverged portion. For prevention of generation of the peel-off phenomenon, the throat portion 1b is required to be made a smoothly curved surface, with the differential coefficient in the change rate of sectional area being not infinite.

As the material for the convergent-divergent nozzle, for example, a variety of materials may be employed: metals such as iron, stainless steel etc., and otherwise synthetic resins such as acrylic resin, polyvinyl chloride, polyethylene, polystyrene, polypropylene, etc., ceramic materials, quartz, glass, etc. The material may be selected in view of nonreactivity with the starting material, processability, and gas releasability within the vacuum system, etc. Also, the inside surface of the convergent-divergent nozzle may be plated or coated with a material which suppresses adhesion or reaction of the starting material on the surface. Specifically, coating with a polyfluoroethylene may be mentioned.

The length of the convergent-divergent nozzle can be determined as desired depending on the size of the device, etc.. In this connection, the heat energy possessed by the starting material is converted to kinetic energy while the material passes through the convergent-divergent nozzle. And, when the starting material is jetted out at supersonic velocity, the heat energy may become extremely small, whereby a cooled state can be created. By utilizing such low temperature state, the starting material can be also jetted out with the energy thereof being fixed.

FIG. 4 shows another example of the present invention.

Similarly as in FIG. 1, the starting material chamber 5, the reaction chambers 2a, 2b and the collecting chamber 6 are connected in series, between the respective chambers, there are interposed controlling chambers 14a–14c, having also openings 3. These controlling chambers 14a–14c are communicated through the valves 8e–8g and the cleaners 9a–9c to the pumps 10–10c. The controlling chamber 14a is provided for controlling easily the pressure ratio before and after the nozzle 1, while the controlling chambers 14b and 14c are provided for preventing mixing of the atmospheres mutually between the reaction chambers 2a and 2b and the collecting chamber 6. Particularly, when the controlling chambers 14a and 14b are evacuated more strongly than the reaction chambers 2a and 2b, mixing of these atmospheres can be prevented more reliably.

In FIG. 4, the same symbols as in FIG. 1 show the same members. Also, the upstream side and the downstream side of the the nozzle in the present invention may be either pressurised, under reduced pressure, closed or open, provided that the pressure control for jetting out the starting material from the nozzle is possible. Also, the reaction chambers 2a and 2b are not limited to two compartments, but three or more compartments can be used.

As an application example by use of the device of the present invention, the following example may be conceivable. Description is made about the case when as the energy imparting means 3a and 3b, those irradiating photoenergy are used, and no gas is flowed from the gas introducing pipes 12a and 12b. For example, when obtaining a film composed primarily of SiC from a gas mixture of disilane ($Si_2H_6$) and hexafluoroethane ($C_2F_6$), an energy necessary for photolysis of disilane is first imparted by excimer laser in the reaction chamber 2a, and then an energy necessary for photolysis of hexafluoroethane with a wavelength-variable laser in the next reaction chamber 2b.

At this time, active species (e.g. $SiH_3$) of silicon are obtained selectively from disilane, and active species of carbon (e.g. $CF_3$) from hexafluoroethane, respectively.

In this case, since the flow is supersonic, active species have sufficient time as compared with the life even when energy may be imparted successively.

Also, in the above case, since the active species containing F is longer in life, it is more effective to excite hexafluoroethane previously.

As an example of the case of utilizing the present invention for heat energy, there may be included the case in which a paraxylylene dimer is pyrolyzed (at about 400° C.) to be converted into a monomer, followed by thermal polymerization (at about 800° C.) to effect film formation by making avail of the beam characteristic on the substrate 11.

The present invention is described in detail by referring to the following Examples.

EXAMPLE 1.

By use of the device shown in FIG. 1, surface treatment of ultra-fine particles was performed. In the starting material tank 7, Ni ultra-fine particles with a diameter of about 1000 Å formed by an in-gas vaporization method were stored. Then, the vacuum evacuation systems 9a–9c were actuated to evacuate the reaction chambers 2a, 2b and the collecting chamber 6, to create a pressure difference between before and after the nozzle 1 provided between the starting material chamber 5 and the reaction chamber 2a.

The Ni ultra-fine particles of the starting material were fed from the starting-material tank 7 into the starting-material chamber 5 with $H_2$ gas as the carrier gas, and jetted out through the nozzle 1 into the reaction chamber 2a by utilizing the pressure difference.

Into the reaction chamber 2a, a gas mixture of $SiH_4$ and $CH_4$ at a ratio of 2:1 was permitted to flow through the gas introducing pipe 12a, and by use of a high pressure mercury lamp as the energy imparting means 3a, the gas mixture of $SiH_4$, $CH_4$ and $H_2$ in the reaction chamber 2a was excited.

On the surfaces of the Ni ultra-fine particles jetted out in a beam from the nozzle 1, very thin a-SiC coated films were formed through the reaction with the excited gas in the reaction chamber 2a.

The Ni ultra-fine particles coated with a film flowed out through the orifice 4 into the reaction chamber 2b.

Into the reaction chamber 2b, $F_2$ gas diluted with Ne to 5% was permitted to flow through the gas introducing pipe 12b.

Gas flow rates were controlled so that the pressures in the reaction chambers 2a and 2b were equal to each other. Accordingly, mixing through mutual diffusion between the gas mixture comprising $SiH_4$ and $CH_4$ and $F_2$ gas can be suppressed at minimum. Since a microwave (2.45 GHz) was employed as the energy imparting means 3b in the reaction chamber 2b, a plasma of a gas mixture of $F_2$ and Ne was formed in the reaction chamber 2b. During passage through the reaction chamber 2b, the surface of the Ni ultra-fine particles was fluorinated and impinged onto the substrate in the collecting chamber to be formed into a film.

The collecting chamber 6 was reduced in pressure to $5 \times 10^{-6}$ Torr or lower to prevent unnecessary adsorption of fluorine gas.

The Ni ultra-fine particles thus subjected to surface treatment had uniformly coated on the surface and therefore were not easily oxidized and also, due to little adsorption of moisture, very stable without denaturation for a long term even when left to stand in the air.

In contrast, when treatment was conducted in the same chamber without provision of a partition wall between the reaction chambers 2a and 2b, SiC layer could not easily be formed on the Ni ultra-fine particle surfaces, whereby the problems such as readiness in peel-off occurred, and changes with lapse of time in flowability, gas adsorption, etc. were recognized.

EXAMPLE 2

By use of the device shown in FIG. 2, Si ultra-fine particles applied with two-layer coating were formed.

Through the gas introducing pipe having the valve 8a, a gas mixture of $SiH_4$ and $H_2$ was introduced into the starting-material chamber 5, and a microwave plasma was generated by throwing a microwave of 2.45 GHz from the microwave-introducing system 12 into the starting material chamber 5 to form fine particles of Si under a pressure of 0.1 Torr.

With a pressure difference created between the starting material chamber and the reaction chambers 2a, 2b, the above Si fine particles were jetted out in a beam through the nozzle 1.

Into the reaction chamber 2a was introduced a gas mixture of $O_2$ gas and Ar gas through the gas introducing pipe 12a, and by use of a microwave introducing system as the energy-imparting means 3a, oxygen plasma was formed in the reaction chamber 2a to form an oxidized coating on the surface of Si ultra-fine particles.

Subsequently, a gas mixture of $CH_4$ and $H_2$ was introduced through the gas introducing system 12b into the reaction chamber 2b and $CH_4$ plasma was generated in the reaction chamber 2b by throwing microwave from the microwave-introducing system 3b to form a coating of a hydrocarbon on the oxidized coating on the Si fine particles.

The Si fine particles having a surface layer with a double layer structure thus formed have a constant oxidation degree on the surface, exhibiting a stable characteristic such that no further oxidation will proceed.

In contrast, when only the reaction chamber 2a was used, although the oxidized coating could be formed on the Si fine particles, an excessive change occurred with time after the coating was taken out into the air after particle formation whereby no degree of constant oxidation could be maintained.

The present invention makes feasible modification or coating of a fine particle surface, or multiple steps of gas phase reactions in a series of systems continuously and efficiently, thus enabling efficient formation of novel fine particles having a new functional characteristics.

What is claimed is:

1. A device for treating fine particles, comprising:
   a plurality of adjacently positioned chambers having partitions therebetween, the environment in each chamber existing at a desired pressure, said chambers including at least one reaction chamber and a collecting chamber;
   each of said partitions having an opening to connect adjacently positioned chambers, said openings being aligned along a linear axis;
   a convergent-divergent nozzle for directing fine particles under pressure through said openings along said linear axis such that said fine particles may be acted upon in one of said reaction chambers by chemical treatment therein and be directed to said collecting chamber;
   means for adjusting the pressure under which said fine particles are directed through said nozzle relative to the pressures of each of said chambers such that said fine particles are projected from said nozzle in a beam having a substantially consistent cross-section in each of said chambers; and
   means for adjusting the pressures of each of said chambers relative to one another such that the pressures of adjacently positioned chambers are substantially equal.

2. A device for treating fine particles according to claim 1, wherein at least one reaction chamber includes a means for introducing a reacting gas to effect said chemical treatment of said fine particles in said at least one reaction chamber.

3. A device for treating fine particles according to claim 1, wherein at least one reaction chamber includes a means for imparting energy to effect said chemical treatment of said fine particles in said at least one reaction chamber.

4. A device for treating fine particles according to claim 1, wherein at least one of said chambers communicates with an evacuating means to maintain the pressure of said at least one chamber at a desired level.

5. A device for treating fine particles according to claim 4, wherein a means of cleaning is provided between said at least one chamber and said evacuating means.

6. A device for treating fine particles, comprising:
   a starting material chamber for forming said fine particles;
   a plurality of adjacently positioned chambers having partitions therebetween, the environment in each chamber existing at a desired pressure, said chambers including at least one reaction chamber and a collecting chamber;
   each of said partitions having an opening to connect adjacently positioned chambers, said openings being aligned along a linear axis;
   a convergent-divergent nozzle for directing fine particles under pressure from said starting material chamber through said openings along said linear axis such that said fine particles may be acted upon in one of said reaction chambers by chemical treatment therein and be directed to said collecting chamber;
   means for adjusting the pressure under which said fine particles are directed from said starting material chamber and through said nozzle relative to the pressures of each of said chambers such that said fine particles are projected from said nozzle in a beam having a substantially consistent cross-section in each of said chambers; and
   means for adjusting the pressures of each of said chambers relative to one another such that the pressures of adjacently positioned chambers are substantially equal.

7. A device for treating fine particles according to claims 6, wherein at least one reaction chamber includes a means for introducing a reacting gas to effect said chemical treatment of said fine particles in said at least one reaction chamber.

8. A device for treating fine particles according to claims 6, wherein at least one reaction chamber includes a means for imparting energy to effect said chemical treatment of said fine particles in said at least one reaction chamber.

9. A device for treating fine particles according to claim 6, wherein at least one of said chambers communicates with an evacuating means to maintain the pressure of said at least one chamber at a desired level.

10. A device for treating fine particles according to claim 9, wherein a means for cleaning is provided between said at least one chamber and said evacuating means.

11. A device for treating fine particles according to claim 6, wherein said starting material chamber is includes a microwave-introducing means.

12. A device for treating fine particles, comprising:

a plurality of adjacently positioned chambers having partitions therebetween, the environment in each chamber existing at a desired pressure, said chambers including at least one reaction chamber and a collecting chamber, at least one of said reaction chambers including a means for introducing a reaction gas and an evacuating means for maintaining the pressure in said at least one reaction chamber at a desired level;

each of said partitions having an opening to connect adjacently positioned chambers, said openings being aligned along a linear axis;

a convergent-divergent nozzle for directing fine particles under pressure through said openings along said linear axis such that said fine particles may be acted upon in one of said reaction chambers by chemical treatment therein and be directed to said collecting chamber;

means for adjusting the pressure under which said fine particles are directed through said nozzle relative to the pressures of each of said chambers such that said fine particles are projected from said nozzle in a beam having a substantially consistent cross-section in each of said chambers; and means for adjusting the pressures of each of said chambers relative to one another such that the pressures of adjacently positioned chambers are substantially equal.

* * * * *

UNITED STATES PATENT AND TRADEMARK OFFICE
CERTIFICATE OF CORRECTION

PATENT NO. : 4,991,541
DATED : February 12, 1991
INVENTOR(S) : HIROYUKI SUGATA, ET AL.

It is certified that error appears in the above-identified patent and that said Letters Patent is hereby corrected as shown below: TITLE PAGE:

IN [56] REFERENCES CITED

Attorney, Agent, or Firm: "Fitzpatrick, Cella Harper & Scinto" should read --Fitzpatrick, Cella, Harper & Scinto--.

COLUMN 1

Line 25, "a" (first occurrence) should read --an--.

COLUMN 2

Line 44, "a" (second occurrence) should be deleted.

COLUMN 3

Line 4, "5" should be deleted.
    Line 11, "vales 8b-8c and" should read --valves 8b-8d and--.
    Line 56, "there." should read --thereon.--.

COLUMN 4

Line 7, "preferably a" should read --preferably be a--.

COLUMN 5

Line 67, "restriction," should read --restriction.--.

COLUMN 7

Line 20, "openings 3." should read --openings 3a, 3b.--.
    Line 35, "pressurised," should read --pressurized,--.

UNITED STATES PATENT AND TRADEMARK OFFICE
CERTIFICATE OF CORRECTION

PATENT NO. : 4,991,541

DATED : February 12, 1991

INVENTOR(S) : HIROYUKI SUGATA, ET AL.

It is certified that error appears in the above-identified patent and that said Letters Patent is hereby corrected as shown below:

COLUMN 8

Line 54, "on" should be deleted.

COLUMN 9

Line 34, "formation" should read --formation,--.

COLUMN 10

Line 48, "claims 6," should read --claim 6,--.
Line 53, "claims 6," should read --claim 6,--.
Line 66, "is" should be deleted.

Signed and Sealed this

Twenty-second Day of September, 1992

Attest:

DOUGLAS B. COMER

Attesting Officer

Acting Commissioner of Patents and Trademarks